US006917254B2

(12) United States Patent
Kaehs

(10) Patent No.: US 6,917,254 B2
(45) Date of Patent: Jul. 12, 2005

(54) BALANCED-TO-UNBALANCED TRANSFORMER

(75) Inventor: Bernhard Kaehs, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 10/416,835

(22) PCT Filed: Jan. 9, 2002

(86) PCT No.: PCT/EP02/00146

§ 371 (c)(1),
(2), (4) Date: Oct. 27, 2003

(87) PCT Pub. No.: WO02/063762

PCT Pub. Date: Aug. 15, 2002

(65) Prior Publication Data

US 2004/0080376 A1 Apr. 29, 2004

(30) Foreign Application Priority Data

Feb. 8, 2001 (DE) ........................................ 101 05 696

(51) Int. Cl.[7] ............................ H03H 7/42; H01F 27/08

(52) U.S. Cl. ........................... 333/25; 333/26; 333/246; 333/247; 336/61; 336/200

(58) Field of Search ........................... 333/25, 26, 238, 333/246, 247; 336/61, 200, 232

(56) References Cited

U.S. PATENT DOCUMENTS

| | | | | |
|---|---|---|---|---|
| 4,186,352 A | | 1/1980 | Hallford | 455/327 |
| 4,193,048 A | | 3/1980 | Nyhus | 333/26 |
| 5,061,910 A | * | 10/1991 | Bouny | 333/26 |
| 5,917,386 A | * | 6/1999 | Dobrovolny | 333/119 |
| 6,144,276 A | | 11/2000 | Booth | 336/61 |
| 6,294,965 B1 | * | 9/2001 | Merrill et al. | 333/26 |

FOREIGN PATENT DOCUMENTS

| | | |
|---|---|---|
| DE | 1938152 | 1/1971 |
| GB | 2084809 | 4/1982 |

OTHER PUBLICATIONS

Translation of International Preliminary Eamination Report form PCT/IPEA/409 dated Oct. 16, 2002.*

* cited by examiner

*Primary Examiner*—Barbara Summons
(74) *Attorney, Agent, or Firm*—Harness, Dickey & Pierce P.L.C.

(57) ABSTRACT

A method relating to a balun for transmitting a high degree of high-frequency power where metal sheet element is soldered onto the loop conductor tract of the symmetrical circuit loop, the conductor track being configured as a printed circuit. The metal sheet element is leaked with a cooling element on the electrically cold mass point of the loop.

16 Claims, 1 Drawing Sheet

BALANCED-TO-UNBALANCED TRANSFORMER

This application is the national phase under 35 U.S.C. §371 of PCT International Application No. PCT/EP02/000146 which has an International filing date of Jan. 2, 2002, which designated the United States of America and which claims priority on Germany Patent Application number 101 05 696.6 filed Feb. 8, 2001, the entire contents of which are hereby incorporated herein by reference.

FIELD OF THE INVENTION

The invention relates to a balanced-to-unbalanced transformer (BALUN) for transmitting large high-frequency power, for example at the balanced output of a transistor power amplifier for coupling to an unbalanced output line.

BACKGROUND OF THE INVENTION

Balanced-to-unbalanced transformers for higher powers have hitherto been constructed in coaxial line technology. This results in relatively bulky arrangements that have to be relatively expensively produced manually and connected as separate components to the rest of the circuit.

It is also already known to produce balanced-to-unbalanced transformers in printed circuit technology and, in doing so, to construct the conductor loops of the transformer either only on the top of the conductor board (British Patent GB 2 084 809) or on the opposite sides of the conductor board (U.S. Pat. No. 4,193,048). The latter balanced-to-unbalanced transformers constructed in printed circuit technology are, however, normally only suitable for transmitting low high-frequency power.

SUMMARY OF THE INVENTION

An object of the invention is to provide a balanced-to-unbalanced transformer for transmitting high power that can be produced easily and inexpensively in printed circuit technology and to specify a method of producing it.

Proceeding from a balanced-to-unbalanced transformer, this object may be achieved. The object may further be achieved by a production method.

An inventive balanced-to-unbalanced transformer can be very easily and inexpensively produced in printed circuit technology directly integrated with the rest of the high-frequency circuit. The sheet-metal part additionally soldered on increases the thermal conduction of the balanced conductor loop to such an extent that the waste heat generated in the transmission of the high-frequency power can be completely dissipated to a heat sink. Compared with a known balanced-to-unbalanced transformer constructed in printed circuit technology, in which the conductor loops are formed only by the thin conductor-board layer, said additional sheet-metal part can therefore transmit two to three times the high-frequency power.

Depending on the transmitted frequency and, consequently, the size of the conductor loops, an inventive balanced-to-unbalanced transformer can be operated, for example, up to a transmission power of 150 watts despite its simple and inexpensive construction. The inventive principle can be applied to all standard balanced-to-unbalanced transformers that are constructed in printed circuit technology and in which the unbalanced conductor loop is constructed either on the same side or on the opposite side of the conductor board. In the same way, the inventive principle is also suitable for balanced-to-unbalanced transformers whose unbalanced loop is constructed as a double loop and that consequently acts as a 4:1 transformer.

An inventive balanced-to-unbalanced transformer can be used wherever fairly high power has to be transmitted between high-frequency circuits. This is the case, for example, in high-frequency transmitters for bringing together or distributing high-frequency power. It has proved particularly advantageous to use an inventive balanced-to-unbalanced transformer at the output of push-pull transistor power amplifiers since this then results in a particularly compact and simple overall structure of a power amplifier having unbalanced output.

Further scope of applicability of the present invention will become apparent from the detailed description given hereinafter. However, it should be understood that the detailed description and specific examples, while indicating exemplary embodiments of the present invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
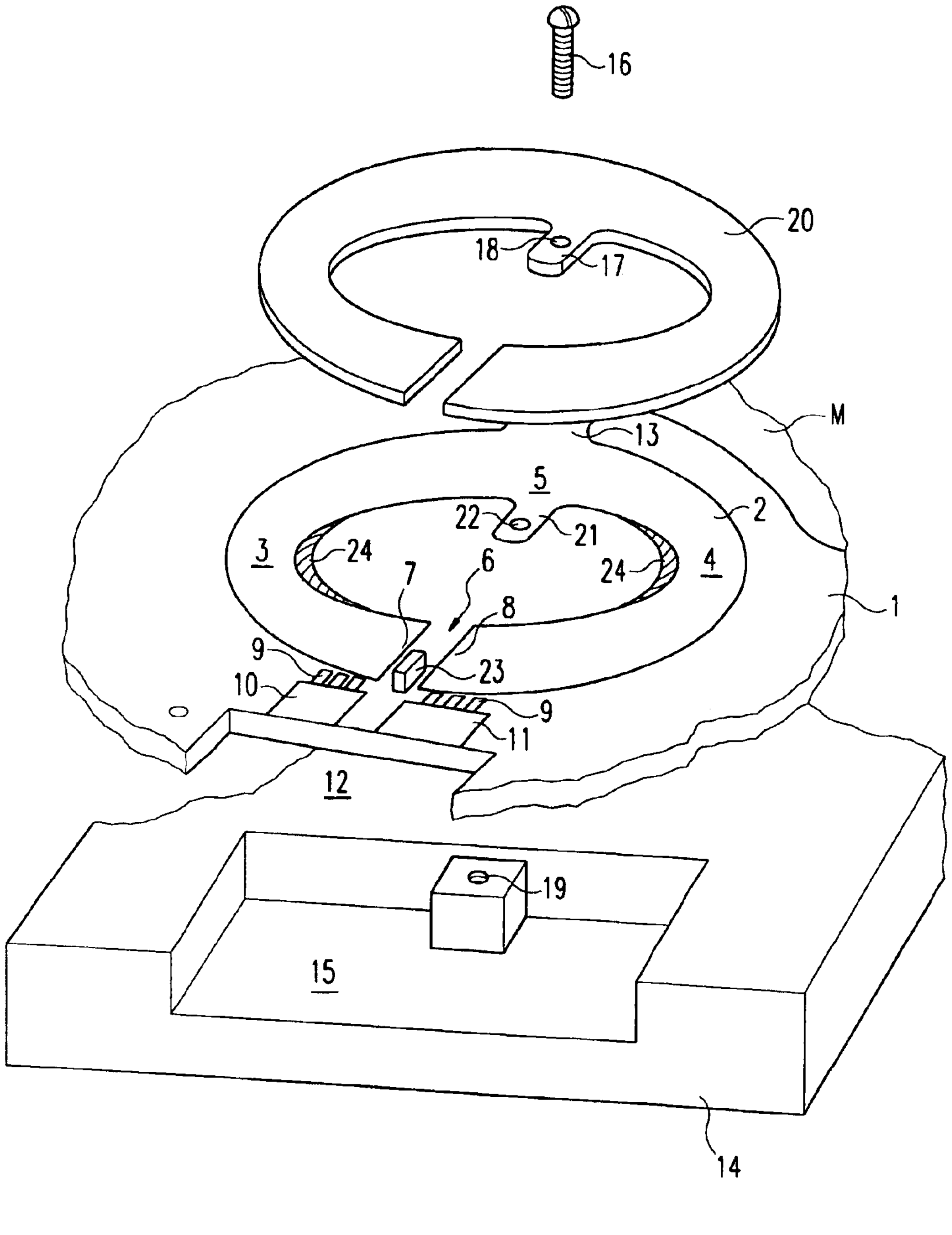
FIG. 1 illustrates a portion of a push-pull transistor power amplifier formed on in printed circuit technology according to an embodiment of the present invention.

FIG. 1 illustrates a portion of a push-pull transistor power amplifier that is formed in printed circuit technology on a conductor board 1 shown in fragment form and whose balanced output is connected to a conductor loop 2, balanced with respect to ground M, of a balanced-to-unbalanced transformer. Said balanced conductor loop 2 has the shape of a circular ring pressed together from opposite sides and having two opposite C-shaped loop halves 3 and 4 that merge into one another integrally on the one side at 5 and form a slot 6 on the opposite side. Two opposite ends 7 and 8, forming the slot 6, of the C-shaped loop halves 3 and 4 form the balanced input of the balanced-to-unbalanced transformer, and they are electrically connected via transformer capacitors 9 to conductor tracks 10 and 11 with which the terminal lugs of the high-frequency power transistor, which is not shown and which is inserted in the rectangular recess 12, make contact.

The input circuit for the power transistor that is not shown and that is preferably likewise constructed as a balanced-to-unbalanced transformer is not shown in FIG. 1, nor are the remaining conductor tracks for wiring the transistors. The connection point 5 of the two loop halves 3 and 4 forms the electrically cold ground point with respect to the balanced input 7, 8 and it is connected via a conductor track 13 to the ground surface M that surrounds the conductor loop 2 and is shown only in fragment form. All the conductor tracks (M, 2, 10, 11, 13 etc.) are constructed in known printed circuit technology on the top of the conductor board 1 as thin metal layers. The unbalanced output conductor loop, which is constructed, for example, as a double loop for the purpose of resistance matching, is constructed in the exemplary embodiment shown on the back of the conductor board 1 directly opposite the conductor loop 2 and is therefore not visible in the figure. The conductor board 1 is mounted on a heat sink 14, which has a countersunk section 15 underneath the conductor loop 2 or the unbalanced conductor loop opposite the latter and not visible.

Soldered onto the top of the balanced conductor loop 2 is an additional loop-shaped copper sheet part 20 shaped in the same way. As a result, the balanced conductor loop of the balanced-to-unbalanced transformer becomes thicker and conducts heat better. The heat that is produced in the transmission of large high-frequency power in the thickened conductor loop 2, 20, and that is also partly introduced into the loop by adjacent capacitors is uniformly distributed by the thickened ring and can be dissipated to the heat sink 14 via a screw 16 that is formed into an assembly bore 18 of a protrusion 17 projecting inwards and can be screwed into a threaded bore 19 in the heat sink 14, and can be extracted in said heat sink by means of the coolant circulating, for example in the heat sink.

Provided on the conductor loop 2 is a matching projection 21 having a matching assembly bore 22, the latter being interconnected and the interconnecting ring, formed on the back of the conductor board 1, of said bore 22 lying flat in the assembled state on the top of the heat sink 14, with the result that the thermal contact between conductor loop and heat sink is increased still further. The thickened construction of the balanced conductor loop 2, 20 on the top of the conductor board 1 makes it possible for the transformer capacitors 9, via which the high-frequency power of the transistor (terminal tracks 10, 11) are routed to the balanced input 7, 8 of the transformer, and, optionally, a further capacitor 23 disposed in the gap 6 to be capable of being soldered likewise over a relatively large area to the copper ring 20 with the result that the waste heat of such capacitors is dissipated well.

The production of such a balanced-to-unbalanced transformer is very easy and inexpensive since the additional copper sheet part 20 can be soldered onto the prepared printed circuit board like a standard component in automatic SMD (surface mounted devices) assembly technology together with the other components of the transistor circuit. For this purpose, shoulder paste is applied to the thin copper layer 2 of the conductor loop 2 in a known manner, the copper sheet part 20 is then placed flat on the solder paste and, finally, the conductor board, assembled in this way also with the remaining components, is introduced into the hot-air furnace. In order to fix the component 20 in position on the conductor loop 2 when the solder paste melts, strip-shaped solder resist 24 is applied to the opposite internal edges of the conductor track 2.

Exemplary embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A balanced-to-unbalanced transformer, comprising a conductor loop, which is balanced with respect to ground, being constructed as a loop-shaped conductor track on a top of a conductor board, wherein to transmit large high-frequency power, a sheet-metal part constructed in matching loop shape is soldered onto the loop-shaped conductor track and waste heat is dissipated at an electrically cold ground point of the balanced conductor loop.

2. The balanced-to-unbalanced transformer according to claim 1, wherein an assembly bore is constructed at the electrically cold ground point of the loop-shaped sheet-metal part for a metal screw that can be screwed into a heat sink disposed on the back of the conductor board.

3. The balanced-to-unbalanced transformer according to claim 2, wherein the sheet-metal part is composed of tin-plated copper.

4. The balanced-to-unbalanced transformer according to claim 2, wherein capacitors disposed at a balanced input of the conductor loop are soldered over a large area to the sheet-metal part.

5. The balanced-to-unbalanced transformer according to claim 2, wherein the assembly bore is constructed in a protrusion projecting radially inwards from the sheet-metal part.

6. The balanced-to-unbalanced transformer according to claim 5, wherein the sheet-metal part is composed of tin-plated copper.

7. The balanced-to-unbalanced transformer according to claim 5, wherein capacitors disposed at a balanced input of the conductor loop are soldered over a large area to the sheet-metal part.

8. The balanced-to-unbalanced transformer according to claim 5, wherein a matching protrusion having an interconnected assembly bore is also constructed at that loop-shaped conductor track of the conductor board that receives the sheet-metal part.

9. The balanced-to-unbalanced transformer according to claim 8, wherein the sheet-metal part is composed of tin-plated copper.

10. The balanced-to-unbalanced transformer according to claim 8, wherein capacitors disposed at a balanced input of the conductor loop are soldered over a large area to the sheet-metal part.

11. The balanced-to-unbalanced transformer according to claim 1, wherein the sheet-metal part is composed of tin-plated copper.

12. The balanced-to-unbalanced transformer according to claim 11, wherein capacitors disposed at a balanced input of the conductor loop are soldered over a large area to the sheet-metal part.

13. The balanced-to-unbalanced transformer according to claim 1, wherein capacitors disposed at a balanced input of the conductor loop are soldered over a large area to the sheet-metal part.

14. The balanced-to-unbalanced transformer according to claim 1, wherein the transformer is disposed in an immediate vicinity of an output of a high-frequency power transistor and an input, balanced with respect to ground, of the conductor loop is connected to a balanced output of an amplifier.

15. A method of producing a balanced-to-unbalanced transformer, comprising: applying solder paste at predetermined solder points on a conductor board on whose surface conductor tracks for a high-frequency transistor power amplifier circuit are formed in printed circuit technology together with a loop-shaped conductor track for a balanced-to-unbalanced transformer, applying a sheet-metal part to the loop-shaped conductor track using automatic assembly technology together with the transistor power amplifier circuit components and, performing a soldering process by heating.

16. The method according to claim 15, further comprising applying solder resist strips to the conductor board at opposite curved internal edges of two mutually opposite halves of the loop-shaped conductor track to fix the applied sheet-metal part in position during the soldering process.

* * * * *